United States Patent
Khanna

(10) Patent No.: US 9,777,197 B2
(45) Date of Patent: *Oct. 3, 2017

(54) UV-CURABLE ANISOTROPIC CONDUCTIVE ADHESIVE

(71) Applicant: SunRay Scientific LLC, Long Branch, NJ (US)

(72) Inventor: S. Kumar Khanna, Carmel, IN (US)

(73) Assignee: SUNRAY SCIENTIFIC, LLC, Long Branch, NJ (US)

( * ) Notice: Subject to any disclaimer, the term of this patent is extended or adjusted under 35 U.S.C. 154(b) by 94 days.

This patent is subject to a terminal disclaimer.

(21) Appl. No.: 14/512,535

(22) Filed: Oct. 13, 2014

(65) Prior Publication Data

US 2015/0107765 A1 Apr. 23, 2015

Related U.S. Application Data

(60) Provisional application No. 61/894,469, filed on Oct. 23, 2013.

(51) Int. Cl.
*C09J 9/02* (2006.01)
*C09J 9/00* (2006.01)
(Continued)

(52) U.S. Cl.
CPC . *C09J 9/02* (2013.01); *C09J 9/00* (2013.01); *H01L 24/29* (2013.01); *H01L 24/75* (2013.01);
(Continued)

(58) Field of Classification Search
None
See application file for complete search history.

(56) References Cited

U.S. PATENT DOCUMENTS 4,170,677 A 10/1979 Hutcheson
4,568,592 A 2/1986 Kawaguchi et al.
(Continued)

FOREIGN PATENT DOCUMENTS

WO 2013052129 A1 4/2013

OTHER PUBLICATIONS

Allen et al. "Chapter 5: UV and Electron Beam Curable Pre-Polymers and Dilutent Monomers: Classification, Preparation, and Properties", Radiation Curing in Polymer Science and Technology: Fundamentals and methods, vol. 1, edited by Fouassier and Rabek . . . published by Springer Science & Business Media, 1993, pp. 225-228, 234-235. Text accessed online from Google Books during a keywords search, these relevant pages attached to the case file as a PDF.*

(Continued)

*Primary Examiner* — Katie L Hammer
(74) *Attorney, Agent, or Firm* — Barnes & Thornburg LLP

(57) ABSTRACT

Illustrative embodiments of anisotropic conductive adhesive (ACA) and associated methods are disclosed. In one illustrative embodiment, the ACA may comprise a binder curable using UV light and a plurality of particles suspended in the binder. Each of the plurality of particles may comprise a ferromagnetic material coated with a layer of electrically conductive material. The electrically conducting material may form electrically conductive and isolated parallel paths when the ACA is cured using UV light after being subjected to a magnetic field.

14 Claims, 3 Drawing Sheets

(51) Int. Cl.
  *H05K 13/04* (2006.01)
  *H05K 3/30* (2006.01)
  *H05K 3/32* (2006.01)
  *H01L 23/00* (2006.01)
  *C08K 9/02* (2006.01)

(52) U.S. Cl.
  CPC ............ *H01L 24/83* (2013.01); *H05K 3/323* (2013.01); *C08K 9/02* (2013.01); *C08K 2201/001* (2013.01); *C08K 2201/01* (2013.01); *H01L 2224/16227* (2013.01); *H01L 2224/2929* (2013.01); *H01L 2224/2936* (2013.01); *H01L 2224/2957* (2013.01); *H01L 2224/29298* (2013.01); *H01L 2224/29355* (2013.01); *H01L 2224/29357* (2013.01); *H01L 2224/29388* (2013.01); *H01L 2224/29393* (2013.01); *H01L 2224/29499* (2013.01); *H01L 2224/29562* (2013.01); *H01L 2224/29639* (2013.01); *H01L 2224/29644* (2013.01); *H01L 2224/32013* (2013.01); *H01L 2224/32057* (2013.01); *H01L 2224/32225* (2013.01); *H01L 2224/75253* (2013.01); *H01L 2224/75265* (2013.01); *H01L 2224/75266* (2013.01); *H01L 2224/75734* (2013.01); *H01L 2224/75735* (2013.01); *H01L 2224/81193* (2013.01); *H01L 2224/8393* (2013.01); *H01L 2224/83192* (2013.01); *H01L 2224/83851* (2013.01); *H01L 2224/83874* (2013.01); *H01L 2924/00014* (2013.01); *H05K 2201/0218* (2013.01); *H05K 2201/0221* (2013.01); *H05K 2201/0323* (2013.01); *H05K 2201/083* (2013.01); *H05K 2203/104* (2013.01)

(56) References Cited

U.S. PATENT DOCUMENTS

| | | |
|---|---|---|
| 4,578,425 A | 3/1986 | Santorelli |
| 4,711,814 A * | 12/1987 | Teichmann ........ G11B 5/70605 252/513 |
| 4,737,112 A | 4/1988 | Jin et al. |
| 4,772,422 A | 9/1988 | Hijikata et al. |
| 4,866,133 A | 9/1989 | Andrews et al. |
| 4,878,978 A | 11/1989 | Goel et al. |
| 4,966,729 A | 10/1990 | Carmona et al. |
| 5,045,249 A | 9/1991 | Jin et al. |
| 5,132,058 A | 7/1992 | Suyama et al. |
| 5,136,365 A | 8/1992 | Pennisi et al. |
| 5,162,087 A | 11/1992 | Fukuzawa et al. |
| 5,169,471 A | 12/1992 | Strasser |
| 5,209,873 A | 5/1993 | Yamamoto et al. |
| 5,221,417 A | 6/1993 | Basavanhally |
| 5,225,966 A | 7/1993 | Basavanhally et al. |
| 5,236,631 A | 8/1993 | Osawa |
| 5,286,417 A | 2/1994 | Mahmoud et al. |
| 5,330,684 A | 7/1994 | Emori et al. |
| 5,344,593 A | 9/1994 | Chiba et al. |
| 5,429,701 A | 7/1995 | Lu |
| 5,438,223 A | 8/1995 | Higashi et al. |
| 5,453,148 A | 9/1995 | Lu et al. |
| 5,453,451 A * | 9/1995 | Sokol ..................... C09D 4/00 427/519 |
| 5,522,962 A | 6/1996 | Koskenmaki et al. |
| 5,624,268 A | 4/1997 | Maeda et al. |
| 5,648,124 A | 7/1997 | Sutor |
| 5,661,042 A | 8/1997 | Fang et al. |
| 5,769,996 A | 6/1998 | McArdle et al. |
| 5,785,913 A | 7/1998 | Clark, Jr. et al. |
| 5,789,278 A | 8/1998 | Akram et al. |
| 5,840,215 A | 11/1998 | Iyer et al. |
| 5,851,644 A | 12/1998 | McArdle et al. |
| 5,891,366 A | 4/1999 | Gruenwald et al. |
| 5,918,113 A | 6/1999 | Higashi et al. |
| 5,965,064 A | 10/1999 | Yamada et al. |
| 6,036,813 A | 3/2000 | Schulz et al. |
| 6,039,896 A | 3/2000 | Miyamoto et al. |
| 6,048,599 A | 4/2000 | Chu et al. |
| 6,107,122 A | 8/2000 | Wood et al. |
| 6,110,399 A | 8/2000 | McArdle et al. |
| 6,137,183 A | 10/2000 | Sako |
| 6,149,857 A | 11/2000 | McArdle et al. |
| 6,171,107 B1 | 1/2001 | Milne |
| 6,180,226 B1 * | 1/2001 | McArdle ................. G03F 7/34 156/234 |
| 6,190,509 B1 | 2/2001 | Haba |
| 6,238,597 B1 | 5/2001 | Yim et al. |
| 6,344,156 B1 | 2/2002 | Yamada et al. |
| 6,352,775 B1 | 3/2002 | Sasaki et al. |
| 6,355,504 B1 | 3/2002 | Jiang |
| 6,368,896 B2 | 4/2002 | Farnworth et al. |
| 6,376,393 B1 * | 4/2002 | Newton ............ G06K 9/00053 438/783 |
| 6,392,306 B1 | 5/2002 | Khandros et al. |
| 6,402,876 B1 | 6/2002 | McArdle et al. |
| 6,579,744 B1 | 6/2003 | Jiang |
| 6,592,783 B2 | 7/2003 | Kumakura et al. |
| 6,733,613 B2 | 5/2004 | Khanna |
| 6,737,300 B2 | 5/2004 | Ding et al. |
| 6,741,019 B1 | 5/2004 | Filas et al. |
| 6,827,880 B2 | 12/2004 | Ishimatsu |
| 6,838,022 B2 | 1/2005 | Khanna |
| 6,909,100 B2 | 6/2005 | Sognefest et al. |
| 7,078,095 B2 | 7/2006 | Tam |
| 7,294,358 B2 | 11/2007 | Tam |
| 7,326,633 B2 | 2/2008 | Chen |
| 7,494,907 B2 | 2/2009 | Brown et al. |
| 7,799,865 B2 | 9/2010 | Ledwidge et al. |
| 8,471,274 B2 | 6/2013 | Golle et al. |
| 8,754,435 B1 | 6/2014 | Tischler et al. |
| 8,933,482 B2 | 1/2015 | Miyata |
| 2002/0014615 A1 | 2/2002 | Yamada et al. |
| 2003/0180508 A1 * | 9/2003 | McArdle ................. G03F 7/34 428/195.1 |
| 2004/0016505 A1 | 1/2004 | Khanna |
| 2004/0161906 A1 | 8/2004 | Khanna |
| 2005/0218377 A1 | 10/2005 | Lawandy |
| 2005/0274454 A1 * | 12/2005 | Extrand ..................... C09J 5/00 156/272.4 |
| 2006/0243972 A1 | 11/2006 | Uang et al. |
| 2006/0249834 A1 | 11/2006 | Uang et al. |
| 2006/0280912 A1 | 12/2006 | Liang et al. |
| 2007/0054984 A1 | 3/2007 | Jun et al. |
| 2007/0059503 A1 | 3/2007 | Park et al. |
| 2007/0249161 A1 * | 10/2007 | Nakaone ................. H01R 12/57 438/637 |
| 2008/0078977 A1 | 4/2008 | Hashiba et al. |
| 2009/0140210 A1 | 6/2009 | Toshioka et al. |
| 2010/0101832 A1 | 4/2010 | Verhaverbeke et al. |
| 2010/0193748 A1 | 8/2010 | Hama et al. |
| 2011/0284262 A1 * | 11/2011 | Chappell ..................... B29C 70/62 174/126.1 |
| 2011/0315956 A1 | 12/2011 | Tischler et al. |
| 2012/0049100 A1 | 3/2012 | Yonetsu et al. |
| 2012/0106111 A1 | 5/2012 | Mazzochette et al. |
| 2012/0107552 A1 | 5/2012 | Tellkamp |
| 2012/0175667 A1 | 7/2012 | Golle et al. |
| 2013/0082298 A1 | 4/2013 | Golle et al. |
| 2013/0285073 A1 | 10/2013 | Golle et al. |
| 2014/0353540 A1 | 12/2014 | Khanna |
| 2015/0021632 A1 | 1/2015 | Taghizadeh et al. |

OTHER PUBLICATIONS

IDEAS Microwave Laboratory: Anisotropic Conductive Adhesives, https://engineering.purdue.edu/IDEAS/ACA.html(2010).

Sungwook Moon et al., "Magnetically Aligned Anisotropic Conductive Adhesive for Microwave Applications," IEEE Transactions on Microwave Theory & Techniques, Dec. 2008, pp. 2942-2949, vol. 56, No. 12.

(56) References Cited

OTHER PUBLICATIONS

Gou-Jen Wang et al., "Ultra Fine Pitch Flat Panel Display Packaging Using 3 μm Conductive Particles," DTIP of MEMS & MOEMS, Apr. 26-28, 2006, 5 pages.

Myung Jin Yim et al., "Recent Advances on Anisotropic Conductive Adhesives (ACAs) for Flat Panel Displays and Semiconductor Packaging Applications," International Journal of Adhesion & Adhesives, Jul. 7, 2006, pp. 304-313, vol. 26.

Sungwook Moon et al., "Multilayer Silicon RF System-in-Package Technique Using Magnetically Aligned Anisotropic Conductive Adhesive," IEEE MTTS Int. Microwave Symp., Jun. 2009, 4 pages.

\* cited by examiner

UV-CURABLE ANISOTROPIC CONDUCTIVE ADHESIVE

CROSS REFERENCE TO RELATED APPLICATION

This application claims the benefit of U.S. Provisional Patent Application No. 61/894,469, filed Oct. 23, 2013, the entire disclosure of which is incorporated by reference herein.

BACKGROUND

Anisotropic conductive adhesive ("ACA") may be utilized to form conductive paths between pairs of aligned contacts, such as a contact of an integrated circuit or integrated circuit package and a contact of a substrate (e.g., a printed circuit board). A typical ACA includes conductive particles suspended in a binder. Such an ACA may be interposed in an uncured state between the integrated circuit or integrated circuit package and the substrate, after which the ACA may be cured in the presence of a magnetic field. The conductive particles of the ACA will form conductive paths between contacts of the integrated circuit or integrated circuit package and of the substrate while, at the same time, the ACA bonds the integrated circuit or integrated circuit package to the substrate.

SUMMARY

According to one aspect, an ACA may comprise a binder curable using ultraviolet ("UV") light and a plurality of particles suspended in the binder. Each of the plurality of particles may comprise a ferromagnetic material coated with a layer of electrically conductive material. The electrically conducting material may form electrically conductive and isolated parallel paths when the ACA is cured using UV light after being subjected to a magnetic field.

In some embodiments, the ACA may be configured to be cured while still being subjected to the magnetic field. In other embodiments, the ACA may be configured to be cured within one minute of being subjected to the magnetic field.

In some embodiments, the binder may comprise a polymer mix of vinyl acrylate and epoxy acrylate. The binder may further comprise a dispersant. The binder may further comprise a tackifier.

In some embodiments, the electrically conductive material may comprise a noble metal. The ferromagnetic material of each of the plurality of particles may comprise a solid sphere. In other embodiments, each of the plurality of particles may further comprise a core formed from at least one of carbon, graphite, glass, and mica, and the core may be coated with the ferromagnetic material.

In some embodiments, an average maximum dimension of the plurality of particles may be between 1 μm and 25 μm. The average maximum dimension may be less than 1 μm.

In some embodiments, each of the plurality of particles may further comprise a moisture barrier surrounding the layer of electrically conductive material prior to the ACA being subjected to the magnetic field. The moisture barrier may surround each of the electrically conductive and isolated parallel paths after the ACA is cured using UV light. The moisture barrier may comprise a solution of phenolic novolak in furfural solvent.

According to another aspect, a method may comprise positioning an ACA between a pair of electrical contacts, where the ACA comprises a binder curable using UV light and a plurality of particles suspended in the binder and where each of the plurality of particles comprises a ferromagnetic material coated with a layer of electrically conductive material, subjecting the ACA to a magnetic field, such that the electrically conducting material of the plurality of particles forms electrically conductive and isolated parallel paths between the pair of electrical contacts, and subjecting the ACA to UV light, after subjecting the ACA to the magnetic field, to cure the ACA.

In some embodiments, subjecting the ACA to UV light may comprise subjecting the ACA to UV light while the ACA is still being subjected to the magnetic field. In other embodiments, subjecting the ACA to UV light may comprise subjecting the ACA to UV light within one minute of the ACA being subjected to the magnetic field.

According to yet another aspect, a method may comprise coating each of a plurality of particles including a ferromagnetic material with a layer of electrically conductive material and dispersing the plurality of particles in a binder curable using UV light to form an ACA.

In some embodiments, dispersing the plurality of particles in a binder curable using UV light may comprise dispersing the plurality of particles in a polymer mix of vinyl acrylate and epoxy acrylate. In some embodiments, the method may further comprise coating each of the plurality of particles with a moisture barrier, after coating each of the plurality of particles with the layer of electrically conductive material and prior to dispersing the plurality of particles in the binder curable using UV light.

BRIEF DESCRIPTION OF THE DRAWINGS

The concepts described in the present disclosure are illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. The detailed description particularly refers to the accompanying figures in which.

DETAILED DESCRIPTION OF THE DRAWINGS

Figure 1:
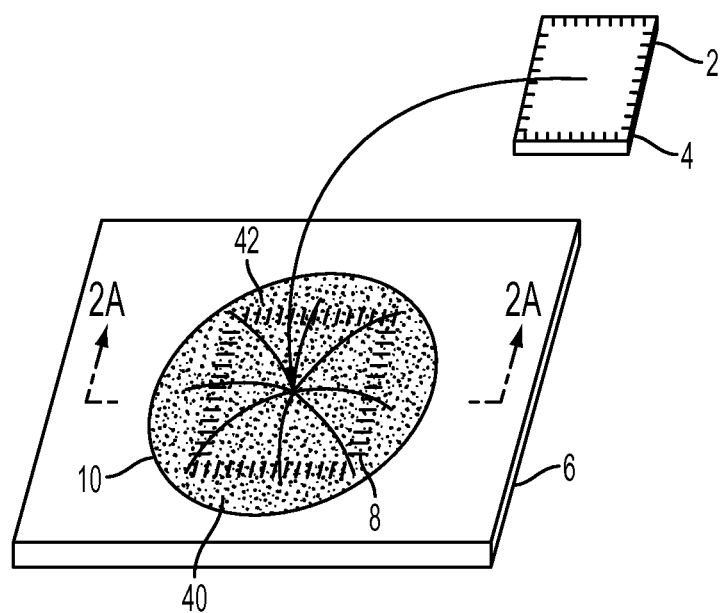
FIG. 1 is a perspective view of one illustrative embodiment of the positioning of an integrated circuit package on an ACA deposited on a substrate.

While the concepts of the present disclosure are susceptible to various modifications and alternative forms, specific exemplary embodiments thereof have been shown by way of example in the drawings and will herein be described in detail. It should be understood, however, that there is no intent to limit the concepts of the present disclosure to the particular forms disclosed, but on the contrary, the intention is to cover all modifications, equivalents, and alternatives falling within the spirit and scope of the present disclosure.

The present disclosure relates to an anisotropic conductive adhesive ("ACA") that is configured to be cured using ultraviolet ("UV") light. The presently disclosed ACA has been found to be particularly suitable for use in forming conductive paths between conductive contacts of an integrated circuit or integrated circuit package and conductive contacts on a substrate that are aligned with the conductive contacts on the integrated circuit or integrated circuit package, while avoiding electrical shorting between adjacent conductive paths. The ACA is particularly suitable for creating isolated, parallel conductive paths between contacts of an integrated circuit and contacts of a substrate having an edge-to-edge spacing less than 250 µm, including spacing as small as about 20 µm to 25 µm.

With reference to FIG. 1, an integrated circuit package 2 includes a plurality of closely spaced contacts 4 positioned on or adjacent the edges of package 2. In FIG. 1, package 2 is illustrated as a leadless chip carrier package. However, in other embodiments, the presently disclosed ACA may be used with other surface mount integrated circuit packages, such as ball grid arrays, dual inline or quad packages having gull-wing or j-shaped leads, and quad flat packs having laterally extending leads, or any other form of integrated circuit package having closely spaced leads. In addition, it is also contemplated that the presently disclosed ACA may be used with unpackaged integrated circuits for flip-chip mounting thereof. As shown in FIG. 1, package 2 is received on a substrate 6 having a plurality of closely spaced contacts 8 disposed in mirror image relation to the contacts 4 of package 2. Prior to mounting package 2 on substrate 6, a drop or coating of uncured ACA 10 is deposited on substrate 6 over the plurality of contacts 8.

Figure 2A:
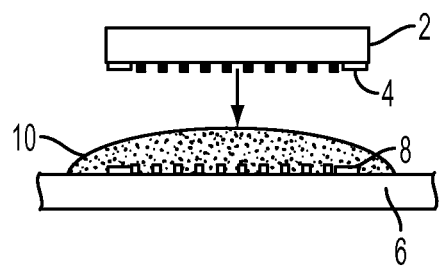
FIG. 2A is a cross-sectional view of the integrated circuit package in spaced relation to the substrate and the ACA taken along section lines 2A-2A in FIG. 1.
Figure 2B:
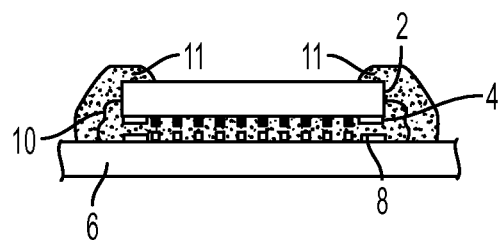
FIG. 2B is a cross-sectional view of the integrated circuit package in contact with the ACA deposited on the substrate, from the same perspective as FIG. 2A.

Referring now to FIGS. 2A and 2B, package 2 is positioned with its contacts 4 in opposition to the contacts 8 of substrate 6. More specifically, each contact 4 of package 2 is positioned in alignment with a corresponding contact 8 of substrate 6. Thereafter, as shown in FIG. 2B, package 2 is moved into contact with ACA 10. In response to this contact, ACA 10 displaces somewhat. However, the viscosity of ACA 10 is such that contacts 4 of package 2 and contacts 8 of substrate 6 are maintained in spaced relation by ACA 10. In other words, package 2 is moved into contact with ACA 10 such that contacts 4 of package 2 and contacts 8 of substrate 6 are not in physical contact with each other. Furthermore, the displacement of ACA 10 is due primarily to the weight of package 2, and only slightly due to the force utilized to move package 2 into contact with ACA 10.

After package 2 is deposited on ACA 10 with each contact 4 in alignment with a corresponding contact 8 of substrate 6, an adhesive 11 may be used to temporarily secure the relative position of package 2 and substrate 6. For instance, adhesive 11 may be deposited around the perimeter of package 2. In other embodiments, adhesive 11 may be deposited on only two or more corners of package 2. After the ACA 10 has been cured, as described below, the adhesive 11 may be removed. It will be appreciated that the use of adhesive 11 to secure the relative position of package 2 and substrate 6 prior to curing of ACA 10 is optional and may not be desirable or needed in some embodiments.

Figure 3:
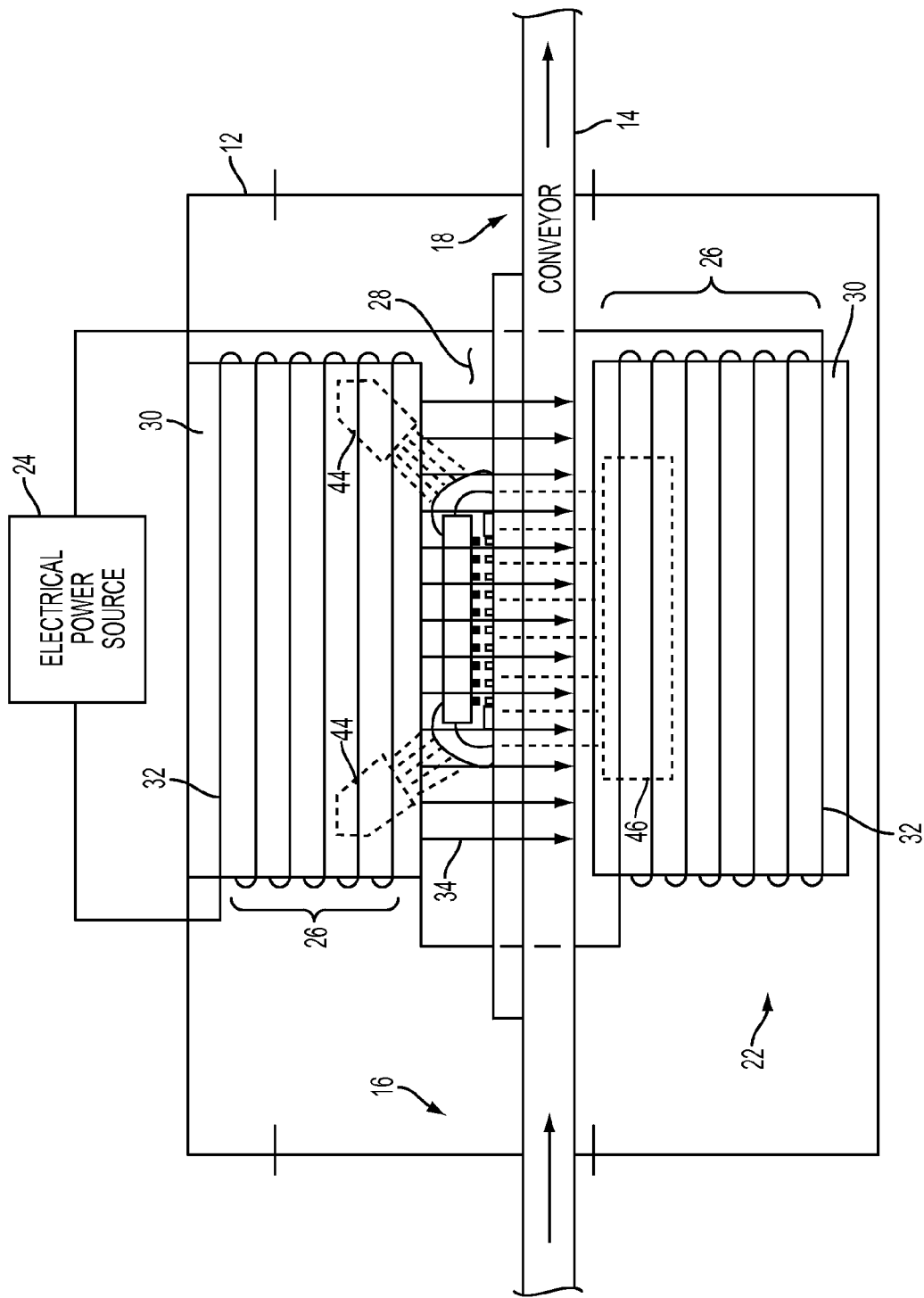
FIG. 3 is a schematic representation of one illustrative embodiment of a curing system having a magnetic field generator.

With reference to FIG. 3, after adhesive 11 has been deposited, the entire assembly (i.e., package 2, substrate 6, and ACA 10) is positioned in a curing system 12. In a production environment, curing system 12 can have a conveyor 14 which extends through curing system 12 between an inlet 16 and outlet 18 thereof for transporting the assembly. Curing system 12 may be embodied as an enclosure of any suitable shape and size in which the assembly can be positioned.

Curing system 12 includes a magnetic field generator 22 disposed therein which is coupled to and controlled by an electrical power source 24 disposed external to curing system 12. Magnetic field generator 22 includes a pair of poles 26 disposed in spaced relation across a gap 28 in which package 2 received on ACA 10 deposited on substrate 6 is positioned in or passes through on conveyor 14. Each pole 26 includes a pole element 30 of ferromagnetic or paramagnetic material having one or more windings 32 of wire (or other suitable conductive material). Windings 32 are electrically insulated from pole elements 30 by a suitable insulator on pole elements 30 and/or a suitable insulator around the wire forming windings 32. Windings 32 of each pole 26 are connected to each other and to electrical power source 24 such that, in response to electrical power source 24 supplying windings 32 with a suitable electrical current, a magnetic field 34 is generated across gap 28.

In the illustrative embodiment of FIG. 3, poles 26 are configured so that magnetic field 34 is highly homogeneous, at least where package 2 received on ACA 10 deposited on substrate 6 is positioned in curing system 12 during curing of ACA 10. In the illustrative embodiment, magnetic field 34 has a homogeneity of greater than 98.5%. In other embodiments, magnetic field 34 may have other levels of homogeneity (e.g., 95%).

Figure 4:
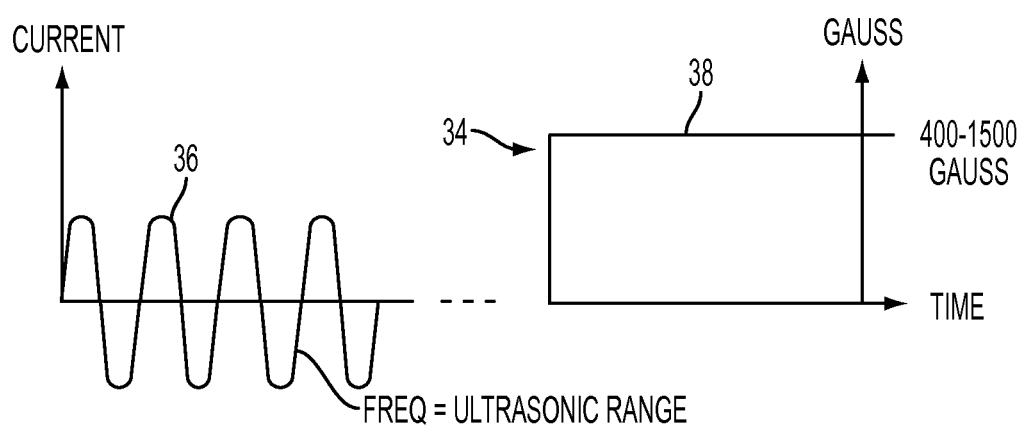
FIG. 4 includes a plot of current versus time that may be used to drive the magnetic field generator of FIG. 3, as well as field strength versus time for the resulting magnetic field.

Referring now to FIG. 4, electrical power source 24 may initially apply an alternating current signal 36 to windings 32 for a time period (e.g., between 15 and 30 seconds), followed by a direct current signal 38 for the remainder of the curing time of ACA 10. The amplitude of alternating current signal 36 may be selected based on the sizes of particles (discussed below) included in ACA 10. By way of example, the amplitude of alternating current signal 36 may be selected so that magnetic field 34 has an alternating magnetic field strength between 10 and 100 gauss. The value of direct current signal 38 may be selected so that magnetic field 34 has a static magnetic field strength between 400 and 1,500 gauss.

Magnetic field 34 shown in FIG. 3 includes the alternating magnetic field produced by magnetic field generator 22 in response to alternating current signal 36 and the static magnetic field produced by magnetic field generator 22 in response to direct current signal 38. It has been observed that alternating current signal 36 operating in the ultrasonic frequency range (e.g., between about 20 kHz and about 500 kHz) works well with ACA 10. However, in other embodiments, other frequencies outside of the ultrasonic frequency range can also be utilized.

In the illustrative embodiment, ACA 10 is subjected to UV light for a suitable curing interval while being subjected to magnetic field 34. As such, the illustrative curing system 12 includes a number of light sources 44, 46 positioned therein (e.g., within windings 32). For instance, a number of light sources 44 may illuminate ACA 10 from one or more sides of the assembly. In such embodiments, any adhesive 11 used to secure the relative position of package 2 and substrate 6 may be at least partially transparent to allow the UV light generated by light sources 44 to reach ACA 10.

Additionally or alternatively, a light sources 46 may illuminate ACA 10 from the bottom of the assembly. In such embodiments, substrate 6 and conveyor 14 may be at least partially transparent to allow the UV light generated by light source 46 to reach ACA 10.

In other embodiments, ACA 10 may be cured within a short time (e.g., one minute or less) after being subjected to magnetic field. In such embodiments, one or more of light sources 44, 46 may be positioned outside of windings 32 (e.g., nearer the outlet 18 of the curing system 12). As such, the conveyor 14 may first move the assembly into magnetic field 34 and then move the assembly into the UV light generated by light sources 44, 46.

Figure 5:
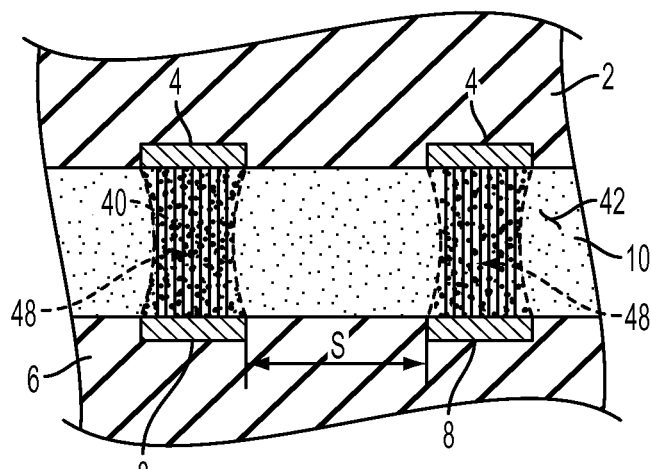
FIG. 5 is an isolated diagrammatic cross-section of one illustrative embodiment of a pair of isolated, parallel conductive paths in a cured ACA.

With reference to FIG. 5, once cured to a solid, ACA 10 forms conductive paths between each contact 4 of package 2 and each corresponding contact 8 of substrate 6 in alignment therewith. It has been observed that the presently disclosed ACA 10 can form electrically conductive, but isolated, parallel conductive paths 48 between adjacent pairs of aligned contacts having an edge-to-edge spacing ("S") as small as 20-25 µm.

As shown in FIGS. 1 and 5, ACA 10 includes a plurality of particles 40 suspended in a binder 42 that is curable using UV light. Each of particles 40 may include a ferromagnetic material (e.g., nickel, iron, cobalt, or the like) coated with a layer of electrically conductive material, such as a noble metal (e.g., gold, silver, or the like). By way of example, particles 40 may include one or more of the following: solid nickel coated spheres, solid nickel flakes, solid carbon/graphite spheres, solid glass spheres, solid mica particles or flakes, and hollow glass spheres. As used herein, the terms "sphere" or "spheres" generally refers to particles are ball-shaped, egg-shaped or minor variations of ball-shaped and egg-shaped. Particles 40 that include a solid carbon/graphite sphere, a solid glass sphere, a solid mica particle or flake, or a hollow glass sphere may each include a coating of ferromagnetic material (e.g., nickel) between the outside surface of the sphere and the coating of electrically conductive material. The coating of ferromagnetic material on these otherwise non-magnetic materials renders them susceptible to the influence of magnetic field 34.

In the illustrative embodiment, each particle 40 along with the one or more coatings thereon has a maximum dimension less than 100 µm. In some embodiments, each particle 40 along with the one or more coatings thereon may have a maximum dimension less than 25 µm. In still embodiments, each particle 40 along with the one or more coatings thereon may have a maximum dimension less than 1 µm. As used herein, the term "maximum dimension" means the largest dimension of the particle measured in any direction. For example, if a particle 40 is a sphere, the maximum dimension is the outside diameter of the electrically conductive material deposited on the sphere. If the particle 40 is a flake having an irregular shape, the maximum dimension is the dimension between the two points of the electrically conductive material deposited over the particle 40 that are farthest apart.

It has been observed that particles 40 having an average maximum dimension between 1 µm and 25 µm enable the formation of isolated, parallel conductive paths between adjacent pairs of aligned contacts having an edge-to-edge spacing as close as 20-25 µm. It will be appreciated a plurality of particles having this average maximum dimension will have some particles having less than 1 µm (e.g., submicron) and some particles having a maximum dimension greater than 25 µm. To this end, it has been observed that in a population of particles 40 with an average maximum dimension between 1 µm and 25 µm, some of the particles can have a maximum dimension in the submicron range.

Particles 40 formed from solid mica particles or flakes and/or hollow glass spheres having a coating of noble metal, such as gold or silver, over a coating of nickel may reduce the edge-to-edge spacing of the parallel conductive paths (as compared to the edge-to-edge spacing realized utilizing similarly sized solid nickel spheres coated with a coating of noble metal, solid carbon/graphite spheres having a coating of noble metal over a coating of nickel, and/or solid glass spheres having a coating of noble metal over a coating of nickel). It is believed that the lower weight of the particles 40 formed from solid mica particles or flakes and/or the hollow glass spheres enables them to move more readily under the influence of magnetic field 34 before binder 42 hardens sufficiently to prevent their movement. Furthermore, smaller sizes of particles 40 enable isolated, parallel conductive paths to be formed between adjacent pairs of aligned contacts having a closer edge-to-edge spacing than larger-size particles 40.

As mentioned above, particles 40 of ACA 10 are dispersed in a UV-curable binder 42. In one illustrative embodiment, UV-curable binder 42 may comprise a polymer mix of vinyl acrylate and epoxy acrylate. In some embodiments, binder 42 may comprise up to 1% by weight of one or more dispersants, such as by way of example, stearic acid, to reduce any clumping of particles 40 in ACA 10. Furthermore, in some embodiments, binder 42 may comprise up to 1% by weight of one or more tackifiers. ACA 10 may comprise, by way of example, about 8% to about 30% by weight of particles 40 dispersed in UV-curable binder 42. The viscosity of ACA 10 may be adjusted by adding variable amounts of solvent, based on the dispensing method to be used to deposit ACA 10 on substrate 6. Illustrative dispensing methods for ACA 10 include screen printing and stenciling.

Over time, particularly in the presence of moisture, the electrically conductive material coating each of particles 40 may begin to migrate through binder 42 of cured ACA 10. This migration of the electrically conductive material of particles 40 may have the adverse effects of breaking electrical contact between aligned contacts 4, 8 of package 2 and substrate 6 and/or of shorting unaligned contacts 4, 8 of package 2 and substrate 6 (i.e., the migration of the electrically conductive material over time may cause the parallel conductive paths to no longer be electrically isolated from one another). As such, to reduce migration of the electrically conductive material of particles 40, illustrative embodiments of ACA 10 may additionally include a moisture barrier applied to each particle 40, as described in U.S. patent application Ser. No. 14/054,529, filed Oct. 15, 2013, the entire disclosure of which is incorporated by reference. For example, as described in the foregoing application, a chemical modifier (e.g., a mix of phenolic novolak in furfural solvent) may be applied to particles 40, before particles 40 are dispersed in binder 42. High-speed mixing may be used to coat each particle 40 with the chemical modifier to provide a moisture barrier outside the layer of electrically conductive material of each particle 40. It is contemplated that, in some embodiments, the ACA 10 may comprise up to 2% by weight of such chemical modifiers.

While certain illustrative embodiments have been described in detail in the drawings and the foregoing description, such an illustration and description is to be considered as exemplary and not restrictive in character, it being understood that only illustrative embodiments have been shown and described and that all changes and modifications that come within the spirit of the disclosure are desired to be protected. There are a plurality of advantages of the present disclosure arising from the various features of the apparatus, systems, and methods described herein. It will be noted that alternative embodiments of the apparatus, systems, and methods of the present disclosure may not include all of the features described yet still benefit from at least some of the advantages of such features. Those of ordinary skill in the art may readily devise their own implementations of the apparatus, systems, and methods that incorporate one or more of the features of the present invention and fall within the spirit and scope of the present disclosure.

The invention claimed is:

1. An anisotropic conductive adhesive (ACA) comprising:
    a binder curable using UV light, wherein the binder comprises a polymer mix of vinyl acrylate and epoxy acrylate; and
    a plurality of particles suspended in the binder, each of the plurality of particles comprising a ferromagnetic material coated with a layer of electrically conductive material, the electrically conductive material forming electrically conductive and isolated parallel paths when the ACA is subjected to the magnetic field,
    wherein each of the plurality of particles further comprises a moisture barrier surrounding the layer of electrically conductive material prior to the ACA being subjected to the magnetic field, wherein the moisture barrier surrounds each of the electrically conductive and isolated parallel paths after the ACA is cured using UV light, and wherein the moisture barrier comprises a solution of phenolic novolac in furfural solvent.

2. The ACA of claim 1, wherein the binder is curable while still being subjected to the magnetic field.

3. The ACA of claim 1, wherein the binder is curable within one minute of being subjected to the magnetic field.

4. The ACA of claim 1, wherein the binder further comprises a dispersant.

5. The ACA of claim 1, wherein the binder further comprises a tackifier.

6. The ACA of claim 1, wherein the electrically conductive material comprises a noble metal.

7. The ACA of claim 1, wherein the ferromagnetic material of each of the plurality of particles comprises a solid sphere.

8. The ACA of claim 1, wherein each of the plurality of particles further comprises a core formed from at least one of carbon, graphite, glass, and mica, the core being coated with the ferromagnetic material.

9. The ACA of claim 1, wherein an average maximum dimension of the plurality of particles is between 1 μm and 25 μm.

10. A method comprising:
    positioning an anisotropic conductive adhesive (ACA) between a pair of electrical contacts, the ACA comprising a binder curable using ultraviolet (UV) light and a plurality of particles suspended in the binder, each of the plurality of particles comprising a ferromagnetic material coated with a layer of electrically conductive material and a moisture barrier surrounding the layer of electrically conductive material, wherein the moisture barrier comprises phenolic novolac and furfural;
    subjecting the ACA to a magnetic field, such that the electrically conducting material of the plurality of particles forms electrically conductive and isolated parallel paths between the pair of electrical contacts and the moisture barrier surrounds each of the electrically conductive and isolated parallel paths; and
    subjecting the ACA to UV light to cure the ACA, wherein the binder comprises a polymer mix of vinyl acrylate and epoxy acrylate.

11. The method of claim 10, wherein subjecting the ACA to UV light comprises subjecting the ACA to UV light while the ACA is still being subjected to the magnetic field.

12. The method of claim 10, wherein subjecting the ACA to UV light comprises subjecting the ACA to UV light within one minute of the ACA being subjected to the magnetic field.

13. A method comprising:
    coating each of a plurality of particles including a ferromagnetic material with a layer of electrically conductive material;
    coating each of the plurality of particles with a moisture barrier comprising phenolic novolac and furfural; and
    dispersing the plurality of particles in a binder curable using ultraviolet (UV) light to form an anisotropic conductive adhesive (ACA).

14. An anisotropic conductive adhesive (ACA) comprising:
    a binder curable using ultraviolet (UV) light; and
    a plurality of particles suspended in the binder, the particles forming electrically conductive and isolated parallel paths when the ACA is subjected to the magnetic field;
    wherein each of the plurality of particles further comprises a moisture barrier comprising phenolic novolac and furfural; and
    wherein the binder comprises a polymer mix of vinyl acrylate and epoxy acrylate.

* * * * *